United States Patent
Pu et al.

(10) Patent No.: US 7,679,178 B2
(45) Date of Patent: Mar. 16, 2010

(54) SEMICONDUCTOR PACKAGE ON WHICH A SEMICONDUCTOR DEVICE CAN BE STACKED AND FABRICATION METHOD THEREOF

(75) Inventors: Han-Ping Pu, Taichung (TW); Chien-Ping Huang, Hsinchu Hsein (TW); Chih-Ming Huang, Hsinchu Hsein (TW); Yu-Po Wang, Taichung Hsien (TW); Cheng-Hsu Hsiao, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 376 days.

(21) Appl. No.: 11/974,441

(22) Filed: Oct. 12, 2007

(65) Prior Publication Data

US 2008/0088011 A1    Apr. 17, 2008

(30) Foreign Application Priority Data

Oct. 12, 2006  (TW) .............................. 95137477 A

(51) Int. Cl.
*H01L 23/02*  (2006.01)
(52) U.S. Cl. ................. 257/686; 257/E23.03; 257/685; 257/723; 438/109
(58) Field of Classification Search .......... 257/E23.024, 257/E21.505, E25.013, E25.03, 685, 686, 257/723, 724, 778, 787; 438/107, 109, 110
See application file for complete search history.

(56) References Cited

U.S. PATENT DOCUMENTS

| | | | |
|---|---|---|---|
| 5,222,014 A | | 6/1993 | Lin |
| 6,815,254 B2* | | 11/2004 | Mistry et al. ................ 438/108 |
| 6,828,665 B2 | | 12/2004 | Pu et al. |
| 6,861,288 B2* | | 3/2005 | Shim et al. ................... 438/109 |
| 7,045,887 B2* | | 5/2006 | Karnezos .................... 257/686 |
| 7,122,904 B2* | | 10/2006 | Tsai et al. .................... 257/778 |
| 7,279,783 B1* | | 10/2007 | Fjelstad et al. .............. 257/686 |
| 7,298,037 B2* | | 11/2007 | Yim et al. .................... 257/686 |
| 7,312,519 B2* | | 12/2007 | Song et al. ................... 257/686 |
| 7,354,800 B2* | | 4/2008 | Carson ....................... 438/109 |
| 7,368,319 B2* | | 5/2008 | Ha et al. ..................... 438/109 |
| 7,435,619 B2* | | 10/2008 | Shim et al. .................. 438/107 |
| 7,445,962 B2* | | 11/2008 | Choi et al. ................... 438/109 |
| 7,456,495 B2* | | 11/2008 | Pohl et al. ................... 257/686 |
| 7,537,962 B2* | | 5/2009 | Jang et al. ................... 438/109 |
| 7,550,832 B2* | | 6/2009 | Weng et al. ................. 257/685 |

(Continued)

*Primary Examiner*—Chris C Chu
(74) *Attorney, Agent, or Firm*—Peter F. Corless; Steven M. Jensen; Edwards Angell Palmer & Dodge LLP

(57) ABSTRACT

A semiconductor package on which a semiconductor device can be stacked and fabrication method thereof are provided. The fabrication method includes the steps of mounting and electrically connecting at least one semiconductor chip on the substrate, mounting an electrical connecting structure consisting of an upper layer circuit board and a lower layer circuit board on the substrate and electrically connecting the electrical connecting structure to the substrate, where the semiconductor chip is received in a receiving space formed in the electrical connecting structure; forming an encapsulant on the substrate encapsulating the semiconductor chip and the electrical connecting structure, and after the encapsulant is formed, exposing top surface of the upper layer circuit board with a plurality of solder pads from the encapsulant to allow at least one semiconductor device to electrically connect the upper layer circuit board so as to form a stack structure.

26 Claims, 10 Drawing Sheets

U.S. PATENT DOCUMENTS

| | | | |
|---|---|---|---|
| 7,557,443 B2 * | 7/2009 | Ye et al. | 257/723 |
| 7,566,966 B2 * | 7/2009 | Chow et al. | 257/723 |
| 7,573,139 B2 * | 8/2009 | Gerber et al. | 257/778 |
| 7,589,408 B2 * | 9/2009 | Weng et al. | 257/686 |
| 2007/0246815 A1 * | 10/2007 | Lu et al. | 257/686 |
| 2008/0042265 A1 * | 2/2008 | Merilo et al. | 257/723 |

* cited by examiner

SEMICONDUCTOR PACKAGE ON WHICH A SEMICONDUCTOR DEVICE CAN BE STACKED AND FABRICATION METHOD THEREOF

FIELD OF THE INVENTION

The present invention relates generally to a semiconductor package, and more particularly to a BGA type semiconductor package.

BACKGROUND OF THE INVENTION

Recently, stackable multi-chip modules have been developed to give considerations of micro miniaturization and increased processing speed of electronic products.

U.S. Pat. No. 5,222,014 discloses a stackable multi-chip module, wherein an upper layer semiconductor package is stacked on and electrically connected with a lower layer semiconductor package thereof through solder joints or solder balls and by repeating the staking of the semiconductor packages, the performance and the processing speed of the module is increased without changing the size of the substrate. As shown in FIG. 7, since solder pads 700b on the lower surface 700a of the substrate 700 of the upper layer semiconductor package 70 are electrically connected to solder pads 710b on the upper surface 710a of the substrate 710 of the lower layer semiconductor package 71 through solder balls 72 disposed therebetween, the number of the solder pads 700b and 710b will affect the electrical connection between the upper layer semiconductor package 70 and the lower layer semiconductor package 71. That is, in the case of more I/O connections required for the semiconductor chip 701 of the upper layer semiconductor package 70, more solder pads 700b should be configured on the lower surface 700a of the substrate 700. However, more solder pads 700b are configured, size of the encapsulant 712 of the lower-layer semiconductor package 71 would be reduced, and accordingly size of the semiconductor chip 711 would also need to be reduced. Hence, size of the semiconductor chip 711 could be used for the lower layer semiconductor package 71 is restricted. From another point of view, if bigger-sized semiconductor chip 711 of the lower layer semiconductor package 71 is required, less solder pads 700b could be configured on the lower surface 700a of the substrate 700, and accordingly, the I/O connections of the upper layer semiconductor package 700 will be reduced, thus the type of the semiconductor package 700 could be used is restricted. In a word, choices of the chip of the stackable multi-chip module 7 will be affected by the number of solder pads and the types of semiconductor package, and thus the use of such a stackable multi-chip module is restricted.

Further, as the upper layer semiconductor package 70 and the lower layer semiconductor package 71 are electrically connected through the solder balls 72, the solder pads 710b of the lower layer substrate 710 cannot be too big, thereby, the height H of the solder balls will be limited. That is, height H of the solder balls has some limitation, which further limits height of the encapsulant 712 of the lower layer semiconductor package 71, generally under 0.3 mm.

According to above drawbacks, U.S. Pat. No. 6,828,665 (patentee is the same as that of the present patent application) discloses a semiconductor package that has a circuit board disposed in the encapsulant, wherein the solder pads of the circuit board being exposed from the encapsulant. Another semiconductor package can be stacked on and electrically connected to the circuit board of the semiconductor package through a plurality of solder balls. As shown in FIG. 8, a circuit board 80 having a plurality of solder pads 801 on top surface 800 thereof is soldered to and electrically connected to a substrate 83 through a plurality of solder balls 81, wherein the substrate 83 has a semiconductor chip 82 mounted thereon, and the semiconductor chip 82 is disposed between the circuit board 80 and the substrate 83. An encapsulant 84 encapsulating the semiconductor chip 82, the solder balls 81 and the circuit board 80 is formed on the substrate 83 with the solder pads 801 exposed from the encapsulant 84. Thus, another semiconductor package 8' with a plurality of solder balls 85' mounted on the bottom surface thereof can be stacked on the top surface 800 of the circuit board 80 and electrically connected to the semiconductor package 8 through the solder balls 85' soldered to the solder pads 801 of the circuit board 80.

As the semiconductor chip 82 and the circuit board 80 are encapsulated by the encapsulant 84 at the same time, area of the bottom surface 802 of the circuit board 80 for mounting of the solder pads 803 will not be affected by size of the encapsulant 84. As a result, size and type of the semiconductor chip 82 can be selected more freely and layout of the solder pads 803 is more flexible compared with U.S. Pat. No. 5,222,014. However, during reflowing the solder balls 81 between the circuit board 80 and the substrate 83, as the semiconductor chip 82 of the semiconductor package 8 has not yet been encapsulated by the encapsulant, high temperature of the reflowing process can adversely affect quality of the bonding wires 86 electrically connecting the semiconductor chip 82 and the substrate 83. Meanwhile, the flux will contaminate the semiconductor chip 82 and the substrate 83. Therefore, reliability of the semiconductor package 8 is poor.

Accordingly, U.S. Pat. No. 6,861,288 discloses a semiconductor package which eliminates the need of solder balls for electrically connecting the substrate and the circuit board for stacking of another semiconductor package. As shown in FIG. 9, a metallic carrier 90 having supporting pins 901 is disposed on a substrate 91 for supporting a circuit board 92 on which another semiconductor package can be stacked. The circuit board 92 is supported by the metallic carrier 90 and located over the semiconductor chip 93. The metallic carrier 90 is attached to the semiconductor chip 93 through a spacer 94 made of thermally conductive glue or a film adhesive. The encapsulant 95 is formed on the substrate 91 and encapsulating the metallic carrier 90, the circuit board 92, the semiconductor chip 93, and the spacer 94. A part of the top surface 920 of the circuit board 92 is exposed from the encapsulant 95 such that solder pads 921 on that can be soldered together with solder balls 96' of another semiconductor package 9', thereby electrically connecting the semiconductor package 9' with the semiconductor package 9 through the solder balls 96'. In addition, the semiconductor chip 93 of the semiconductor package 9 is electrically connected to the substrate 91 through a plurality of first bonding wires 97, and the circuit board 92 is electrically connected to the substrate 91 through a plurality of second bonding wires 98. For encapsulating the second bonding wires 98, the top surface 950 of the encapsulant 95 needs to be higher than exposed top surface 920 of the circuit board 92. Therefore, a concave 951 is formed on the top surface 920.

However, the metallic carrier 90 disposed on the semiconductor chip 93 complicates the packaging process and increases the cost. Meanwhile, there are multiple contacting interfaces, which are the surface-to-surface bonding of the circuit board 92 and the metallic carrier 90, the metallic carrier 90 and the spacer 94, and the spacer 94 and the semiconductor chip 93, in the semiconductor package 9, which can more easily result in delamination phenomenon in temperature cycle in fabrication process and in operating status of the semiconductor package, thus adversely affecting the quality and reducing the reliability of products. Further, as shown in FIG. 10, the mold M consisting the upper mold M1 and the lower mold M2 for forming the encapsulant 95 needs to have an insert portion in the upper mold M1 so as to form an encapsulant 95 completely encapsulating the second bonding wires 98 being higher than the exposed top surface 920 of the circuit board 92. The use of the specific upper mold M1 increases the fabrication cost.

Therefore, there is a need to provide a semiconductor package on which a semiconductor device can be stacked for solving the above problems.

SUMMARY OF THE INVENTION

According to the above drawbacks, an objective of the present invention is to provide a semiconductor package on which a semiconductor device can be stacked without limiting type and I/O connections of the semiconductor device and a fabrication method thereof.

Another objective of the present invention is to provide a semiconductor package on which a semiconductor device can be stacked and a fabrication method thereof, with the encapsulated chip type and I/O connections of the semiconductor device not being affected by size of the encapsulant.

Still another objective of the present invention is to provide a semiconductor package on which a semiconductor device can be stacked and a fabrication method thereof, with height of the encapsulant not being limited by the encapsulated chip.

Another objective of the present invention is to provide a semiconductor package on which a semiconductor device can be stacked and a fabrication method thereof, without the contamination of the semiconductor chip and the substrate in the reflow process.

A further objective of the present invention is to provide a semiconductor package on which a semiconductor device can be stacked and a fabrication method thereof, without a metallic carrier for supporting the electrical connecting structure which is used for stacking of the semiconductor device.

Still another objective of the present invention is to provide a semiconductor package on which a semiconductor device can be stacked and a fabrication method thereof, without additional fabrication cost due to use of a special mold.

In order to attain the above and other objectives, the present invention discloses a semiconductor package on which a semiconductor device can be stacked, comprising a substrate having a plurality of first bonding pads and second bonding pads; at least a semiconductor chip mounted on the substrate; a plurality of first electrical connecting elements for electrically connecting the semiconductor chip and the plurality of first bonding pads of the substrate; an electrical connecting structure mounted on the substrate and being consisting of an upper layer circuit board and a lower layer circuit board electrically connected thereto, wherein the upper layer circuit board has a plurality of solder pads and is suspended a distance above the semiconductor chip via being supported by the lower layer circuit board; a plurality of second electrical connecting elements for electrically connecting the lower layer circuit board and the plurality of second bonding pads of the substrates so as to electrically connect the electrical connecting structure to the substrate; and an encapsulant formed on the substrate for encapsulating the semiconductor chip, the plurality of first electrical connecting elements, the electrical connecting structure and the plurality of second electrical connecting elements, wherein the plurality of solder pads on upper surface of the upper layer circuit board are exposed from the encapsulant such that a semiconductor device can be stacked on the upper layer circuit board and electrically connected with the semiconductor package through the plurality of solder pads.

The upper layer circuit board of the electrical connecting structure is soldered to and electrically connected with the lower layer circuit board by solder material for finishing the reflow of the solder material before adhering the electrical connecting structure to the substrate. That is, the reflow process is performed before the electrical connecting structure is formed. Meanwhile, the second electrical connecting elements for electrically connecting the electrical connecting structure and the substrate are bonding wires, where no reflow process is need. Therefore, problems of contamination of the semiconductor chip and the substrate and adversely affected quality of the second electrical connecting elements resulted from performing the reflow process are overcome.

Size of the lower layer circuit board is smaller than that of the upper layer circuit board. There are two or four lower layer circuit boards respectively attached to the two opposing sides or four sides of the bottom surface of the upper layer circuit board so as to define thereby a receiving space under the upper layer circuit board for receiving the semiconductor chip on the substrate and the plurality of first electrical connecting elements electrically connecting the semiconductor chip and the substrate.

The electrical connecting structure could be constituted by pairs of the upper layer circuit board staggered connected to the lower layer circuit boards for further reducing the material cost.

The first electrical connecting elements are bonding wires or solder bumps. When the first electrical connecting elements are solder bumps, the semiconductor chip is flip-chip electrically connected with the substrate.

The present invention further discloses a fabrication method of a semiconductor package on which a semiconductor device can be stacked, which comprises the steps of: preparing an electrical connecting structure consisting of an upper layer circuit board and a lower layer circuit board electrically connected thereto, where the upper layer circuit board has a plurality of solder pads on the upper surface thereof, and a receiving space under the upper layer circuit board is defined by the upper and the lower layer circuit boards; adhering the electrical connecting structure to a substrate with at least one semiconductor chip mounted thereon with the semiconductor chip received in the receiving space, where the substrate has a plurality of first bonding pads and a plurality of second bonding pads, the lower layer circuit board has a plurality of third bonding pads, the first bonding pads are located in an area covered by the electrical connecting structure and the second bonding pads are located outside the area covered by the electrical connecting structure; electrically connecting the semiconductor chip are to the first bonding pads by a plurality of first electrical connecting elements; electrically connecting the plurality of third bonding pads of the electrical connecting structure to the second bonding pads through a plurality of second electrical connecting elements; and forming an encapsulant encapsulating the semiconductor chip, the electrical connecting structure, and the first and second electrical connecting elements with the solder pads on the upper surface of the upper layer circuit board are exposed from the encapsulant such that at least one semiconductor device stacked on the upper layer circuit board of the electrical connecting structure can be electrically connected to the semiconductor package through the solder pads.

According to another embodiment of a fabrication method of a semiconductor package on which a semiconductor device can be stacked of the present invention, in addition to the mentioned steps, the fabrication method further comprises the steps of attaching a tape to the upper surface of the upper layer circuit board after the step of adhering the electrical connecting structure to a substrate so as to cover the plurality of solder pads, thereby protecting the solder pads from being contaminated in the molding process; and removing the tape for accordingly exposing the solder pads from the encapsulant after the step of forming an encapsulant. Therefore, the present embodiment could simply expose the solder pads from the encapsulant simply by tearing the tape, i.e. without performing a post treatment for cleaning the upper surface of the upper layer circuit board.

According to the present invention, instead of a specific mold, a conventional mold can be used for forming the encapsulant, thus the fabrication cost is saved. Further, as the bonding wires instead of solder balls are used for electrical connections between the electrical connecting structure and the substrate, a reflow process is not needed, which accordingly increases the quality and reliability of the semiconductor package of the present invention.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be made without departing from the spirit of the present invention.

First Embodiment

Figure 1A:
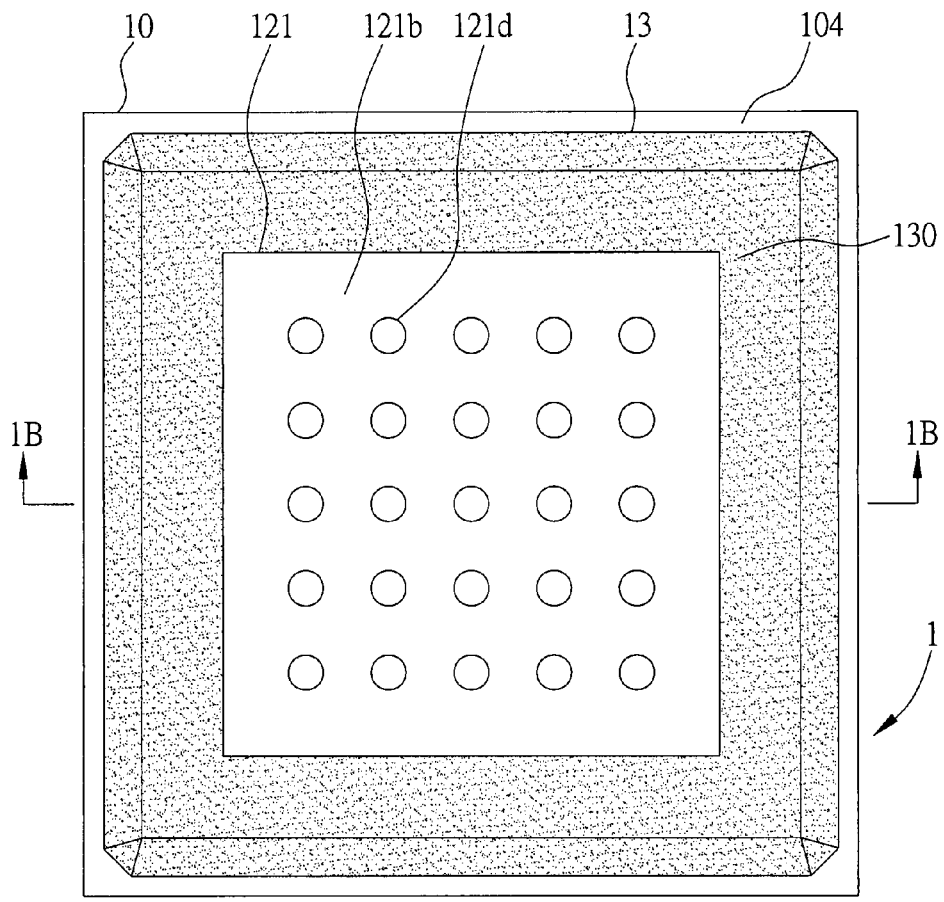
FIG. 1A is schematically showing a top view of a semiconductor package according to a first embodiment of the present invention.
Figure 1B:
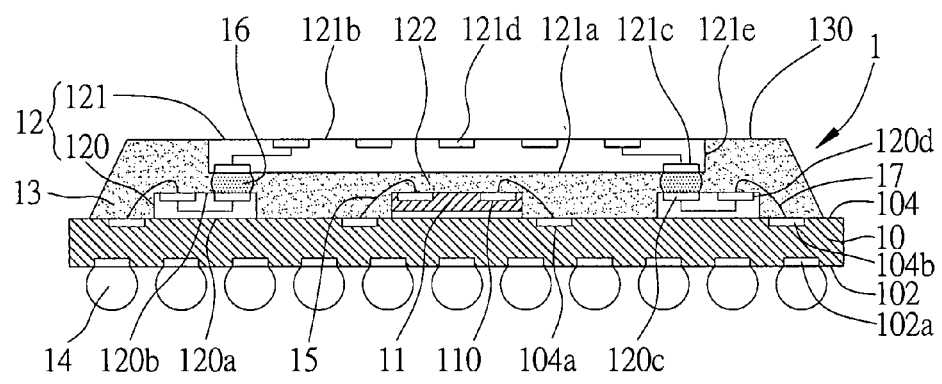
FIG. 1B is a schematic cross-sectional view of the semiconductor package of FIG. 1A along a sectional line 1B-1B.

FIG. 1A is schematically showing a top view of a semiconductor package 1 according to a first embodiment of the present invention. FIG. 1B is a schematic cross-sectional view of the semiconductor package 1 of FIG. 1A along a sectional line 1B-1B. As shown in FIGS. 1A and 1B, the semiconductor package 1 mainly comprises a substrate 10, a semiconductor chip 11 adhered to the substrate 10, an electrical connecting structure 12 mounted on the substrate 10, and an encapsulant 13 formed on the substrate 10 and encapsulating the semiconductor chip 11 and the electrical connecting structure 12.

The substrate 10 is a Ball-Grid-Array (BGA) type substrate. That is, a plurality of first solder pads 102a are mounted on bottom surface 102 of the substrate 10 for allowing solder balls 14 to be mounted thereon. Thus, the semiconductor package 1 can be electrically connected to an external device such as a printed circuit board through the solder balls 14. As formation of the first solder pads 102a and the soldering between the first solder pads 102a and the solder balls 14 are well known in the art, detailed descriptions thereof are omitted. A plurality of first bonding pads 104a and a plurality of second bonding pads 104b are formed on top surface 104 of the substrate 10 where outside the die-mount area for attaching the semiconductor chip 11 with the first bonding pads 104a being positioned more close to the semiconductor chip 11 and the second bounding pads 104b being positioned more far away from the semiconductor chip 11 respectively. In more detail, the first bonding pads 104a are located on the top surface 104 of the substrate 10 in an area covered by the electrical connecting structure 12 and the second bonding pads 104b are located on the top surface 104 of the substrate 10 outside the area covered by the electrical connecting structure 12.

The semiconductor chip 11 is adhered to the top surface 104 of the substrate 10 by a conventional silver paste or a polyimide film. The semiconductor chip 11 has a plurality of third bonding pads 110 electrically connected to the corresponding first bonding pads 104a of the substrate 10 through a plurality of gold wires, and the semiconductor chip 11 is electrically connected to the substrate 10 thereby.

The electrical connecting structure 12 is consisting of four lower layer circuit boards 120 and an upper layer circuit board 121 mounted on the lower layer circuit boards 120. Area of each of the lower layer circuit boards 120 is smaller than that of the upper layer circuit board 121. The lower layer circuit boards 120 are positioned around the upper layer circuit board 121, connected to the bottom surface of the upper layer circuit board 121 and protruding from lateral sides 121e of the upper layer circuit board 121, thereby forming a receiving space 122 inside the electrical connecting structure 12 for receiving the semiconductor chip 11 and the gold wires 15. That is, the receiving space 122 is big enough to sufficiently receive the semiconductor chip 11 and the gold wires 15 and prevent the gold wires 15 from contacting the electrical connecting structure 12. Each of the lower layer circuit boards 120 has a lower surface 120a and an upper surface 120b opposite to the lower surface 120a, wherein a plurality of second solder pads 120c are formed on the upper surface 120b of the lower layer circuit boards 120 at an area covered by the upper layer circuit board 121, and a plurality of third bonding pads 120d electrically connected to the second solder pads 120c are formed on the upper surface 120b of the lower layer circuit boards 120 at an area that is not covered by the upper layer circuit board 121. Meanwhile, the electrical connecting structure 12 is adhered to the top surface 104 of the substrate 10 through adhering the lower surface 120a of the lower layer circuit board 120 to the top surface 104 of the substrate 10 by a conventional adhesive.

The upper layer circuit board 121 has a lower surface 121a and an upper surface 121b opposite to the lower surface 121a. A plurality of third solder pads 121c are formed on the lower surface 121a of the upper layer circuit board 121 and are corresponding to the second solder pads 120c of the lower layer circuit board 120. A plurality of fourth solder pads 121d arranged in an array and electrically connected to the third solder pads 121c are formed on the upper surface 121b of the upper layer circuit board 121. A plurality of solder pastes or solder balls 16 are positioned between the third solder pads 121c of the upper layer circuit board 121 and the second solder pads 120c of the lower layer circuit board 120 such that the upper layer circuit board 121 can be electrically connected to the lower layer circuit board 120 through the solder pastes or solder balls 16. The solder pastes or solder balls 16 can be formed by the conventional surface mount technology and so on. The lower layer circuit board 120 and the upper layer circuit board 121 in the application could be the well-known circuit boards, and accordingly the well-known fabrication methods and materials should be used in the present application. Meanwhile, a plurality of bonding wires 17 are provided for electrically connecting the third bonding pads 120d of the lower layer circuit boards 120 to the second bonding pads 104b on the top surface 104 of the substrate 10, thereby electrically connecting the electrical connecting structure 12 to the substrate 10.

The encapsulant 13 can be formed of a conventional polymer material such as an epoxy resin through a conventional molding process by using a conventional mold. After the encapsulant 13 is formed on the substrate, the upper surface 121b of the upper layer circuit board 121 is exposed from the encapsulant, where the upper surface 121b of the upper layer circuit board 121 and the top surface 130 of the encapsulant 13 are in the same plane. Another semiconductor package (not shown) can be stacked on the upper surface 121b of the upper layer circuit board 121 and electrically connected to the semiconductor package 1 through the fourth solder pads 121d. Since the upper surface 121b of the upper layer circuit board 121 and the top surface 130 of the encapsulant 13 are in the same plane, a conventional mold with a flat top type mold cavity instead of a specific mold such as an insert mold as disclosed by U.S. Pat. No. 6,861,288 can be used in the molding process of the present application, thereby the fabrication cost is saved.

Further, according to the present invention, the electrical connecting structure 12 is electrically connected to the substrate 10 by the bonding wires 17, and the soldering between the upper layer circuit board 121 and the lower layer circuit boards 120 of the electrical connecting structure 12 is finished before that the electrical connecting structure 12 is adhered to the substrate 10, thus preventing the conventional problems such as substrate and chip contamination and adversely affected bonding wire quality occurring in the reflow process for electrically connecting the circuit board to the substrate through solder balls. Because the electrical connecting structure 12 is directly adhered to the substrate 10 without contacting the semiconductor chip 11, problems such as too many adhering interfaces and delamination occurred in U.S. Pat. No. 6,861,288 are avoided, thereby the fabrication cost is saved and the fabrication process is simplified in the present application.

Furthermore, the semiconductor chip 11 and the gold wires 15 that are received in the receiving space 122 of the electrical connecting structure 12 do not need to be encapsulated first before the mounting of the electrical connecting structure, therefore, limitations on the number of the solder pads of the substrate caused by size of the lower layer semiconductor package disclosed by U.S. Pat. No. 5,222,014 are overcome. Meanwhile, since the number of the solder pads for electrically connecting the semiconductor package 1 with another semiconductor package is not affected by the encapsulant, the respective types and sizes of the semiconductor chip 11 and the another semiconductor package stacked thereon can be selected more freely, thus increasing the combination and application flexibility of the present invention in view of the mentioned prior art. Moreover, by electrically connecting the semiconductor package 1 to another semiconductor package through the upper surface 121b, which is exposed from the encapsulant 13, the present invention is also free from the problems such as limitation on height of the lower semiconductor package depending on height of the solar balls, limitation on the types and sizes of the semiconductor chip, and the bonding wire quality of U.S. Pat. No. 5,222,014 that electrically connects the upper layer semiconductor package with the lower layer semiconductor package through solder balls.

The fabrication method of the semiconductor package 1 of the first embodiment is described as follows.

Figure 2A:
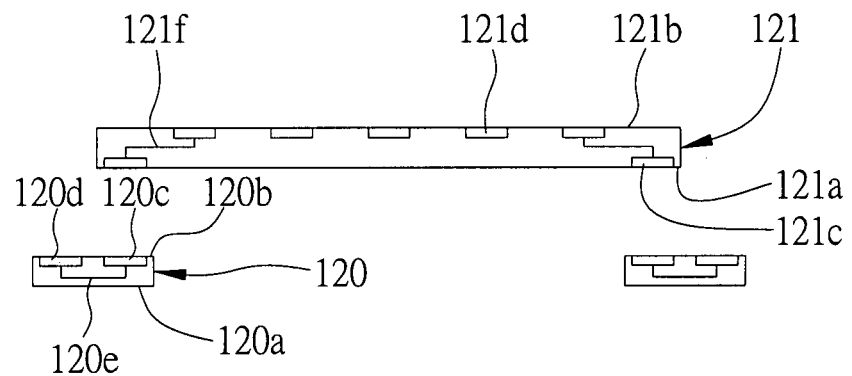
FIGS. 2A to 2F are schematic diagrams showing a fabrication method of the semiconductor package according to a first embodiment of the present invention.

Referring to FIG. 2A, a lower circuit board 120 and an upper layer circuit board 121 are respectively prepared, wherein a row of third solder pads 120c and a row of third bonding pads 120d corresponding to the third solder pads 120c are formed on the upper surface 120b of the lower layer circuit board 120; the second solder pads 120c are electrically connected to the third bonding pads 120d through the circuit 120e; a plurality of third solder pads 121c are formed on the lower surface 121a of the upper layer circuit board 121 at predefined positions; a plurality of fourth solder pads 121d arranged in an array are formed on the upper surface 121b of the upper layer circuit board 121, and the fourth solder pads 121d on the upper surface 121b are electrically connected to the third solder pads 121c on the lower surface 121a through circuits 121f. Size of each of the lower layer circuit board 120 is smaller than that of the upper layer circuit board 121. The upper layer circuit board 121 and the lower layer circuit board 120 can be separately formed or integrally formed as a piece of circuit board in an array according to the size requirement, which is not limited to the present embodiment.

Figure 2B:
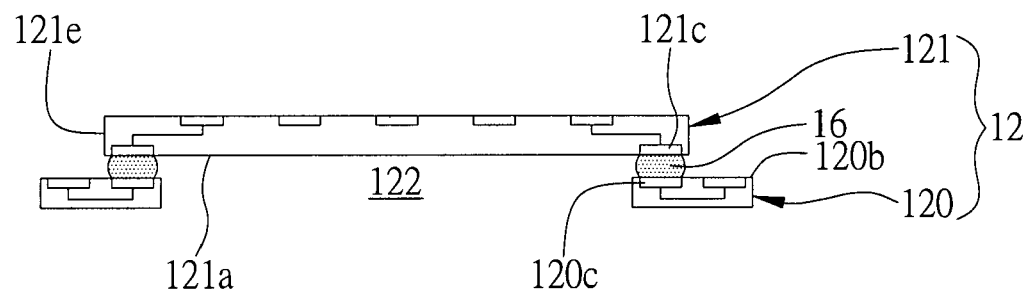
Figure 2C:
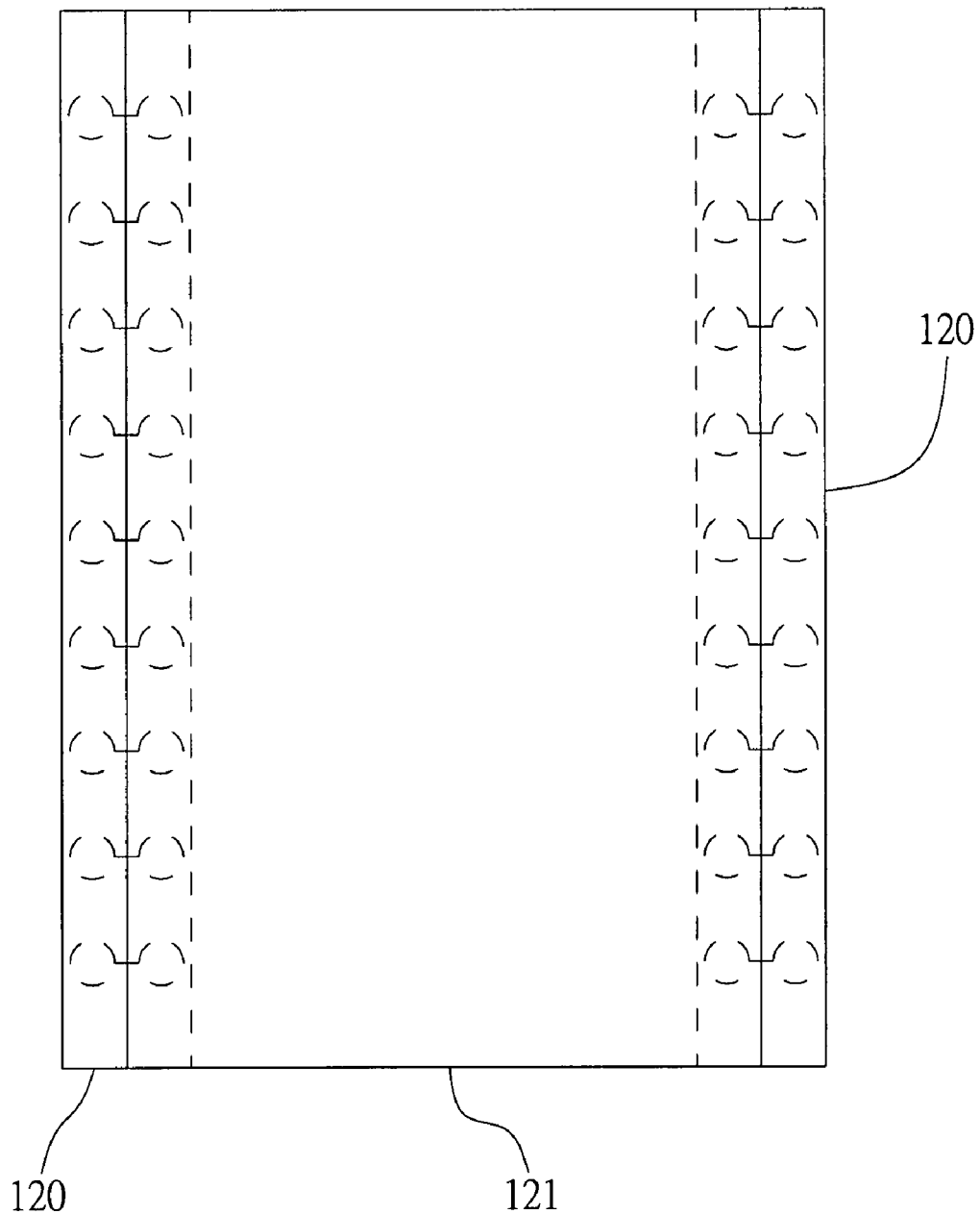
Figure 2D:
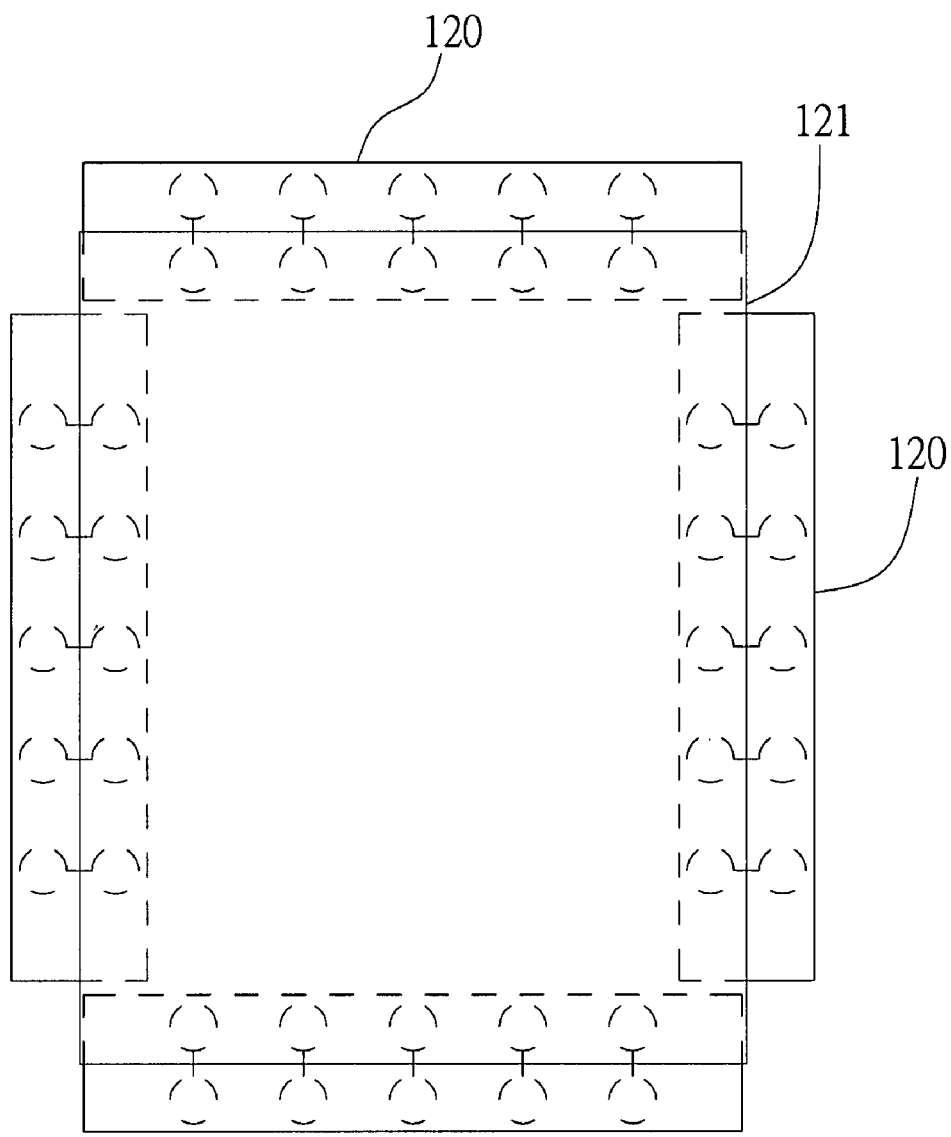

As shown in FIG. 2B, by using a surface mount technology followed by a reflow process, a plurality of solder balls 16 are soldered between the third solder pads 121c on the lower surface 121a of the upper layer circuit board 121 and the second solder pads 120c of the upper surface 120b of the lower layer circuit board 120 for electrically connecting the upper layer circuit board 121 to the lower layer circuit board 120 through the solder balls 16, thereby forming an electrical connecting structure 12. Therein, a part of the upper surface 120b where the second solder pads 120c are formed is covered by the upper layer circuit board 121 while the other part of the upper surface 120b where the third bonding pads 120d are formed is not covered by the upper layer circuit board 121, that is, the upper surface 120b where the third bonding pads 120d are formed is protruding from lateral side 121e of the upper layer circuit board 121. An interval is formed between two opposing lower layer circuit boards 120, and accordingly a receiving space 122 is formed in the electrical connecting structure 12. The number of the lower layer circuit boards 120 can be two or four, which are respectively illustrated in FIGS.

2C and 2D. It should be noted that the number of the lower layer circuit boards 120 is not limited to the present embodiment.

Figure 2E:
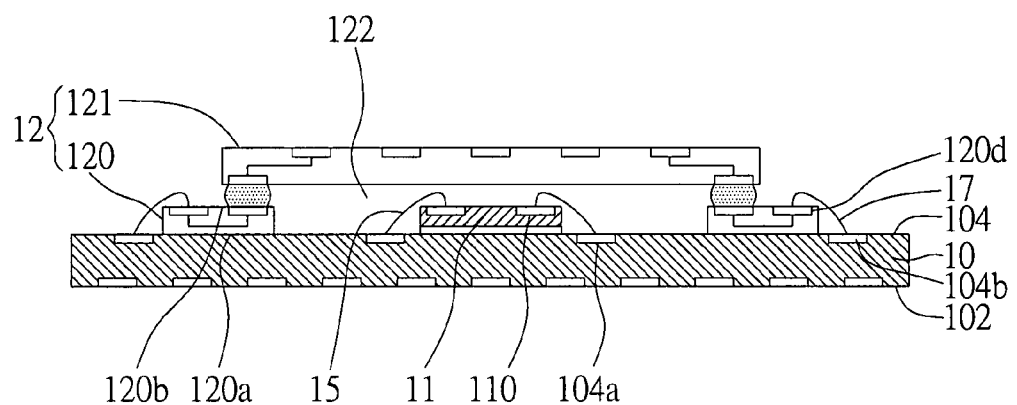

As shown in FIG. 2E, the electrical connecting structure 12 is adhered to top surface 104 of a substrate 10 by using a conventional adhesive, wherein the top surface 104 of the substrate 10 has a semiconductor chip 11 pre-adhered thereto and a plurality of first bounding pads 104a and second bonding pads 104b located outside the adhering area of the semiconductor chip 11. A plurality of third bonding pads 110 are formed on the semiconductor chip 11, and the semiconductor chip 11 is electrically connected to the substrate 10 by respectively connecting the third bonding pads 110 to the first bounding pads 104a on the top surface 104 of the substrate 10 through a plurality of gold wires 15. Meanwhile, the third bonding pads 120d on the upper surface 120b of the lower layer circuit board 120 are respectively connected to the second bonding pads 104b on the top surface 104 of the substrate 10 through a plurality of bonding wires 17 so as to electrically connect the electrical connecting structure 12 to the substrate 10. Since the electrical connecting structure 12 has a receiving space 122, after the electrical connecting structure 12 is adhered to the substrate 10, the semiconductor chip 11 and the gold wires 15 are all received in the receiving space 122 with the receiving space 122 being big enough to prevent the gold wires 15 from being contacted with the electrical connecting structure 12. Therefore, the semiconductor chip 11 and the gold wires 15 do not need to be encapsulated first by the encapsulant, and accordingly the adhering between the semiconductor chip 11 and the substrate 10 will not be affected by the encapsulant. As a result, the type and size of the semiconductor chip 11 can be selected with great flexibility, and height of wireloop of gold wires 15 do not need to be particularly lowered. Thus, the gold wires 15 can be kept in good quality.

In addition, the adhering of the lower layer circuit board 120 to the substrate 10 is located between the first bounding pads 104a and the second bounding pads 104b. As the electrical connecting structure 12 of the present invention is adhered to the substrate 10 through the lower layer circuit board 120 thereof, and is electrically connected to the substrate 10 through the bonding wires 17, solder balls are not needed in the present invention. As a result, limitation on type and size of the semiconductor chip and the arc height of the gold wires caused by the height of the solder balls are eliminated, and contaminations of the semiconductor chip and the substrate in reflowing the solder balls are prevented.

Figure 2F:
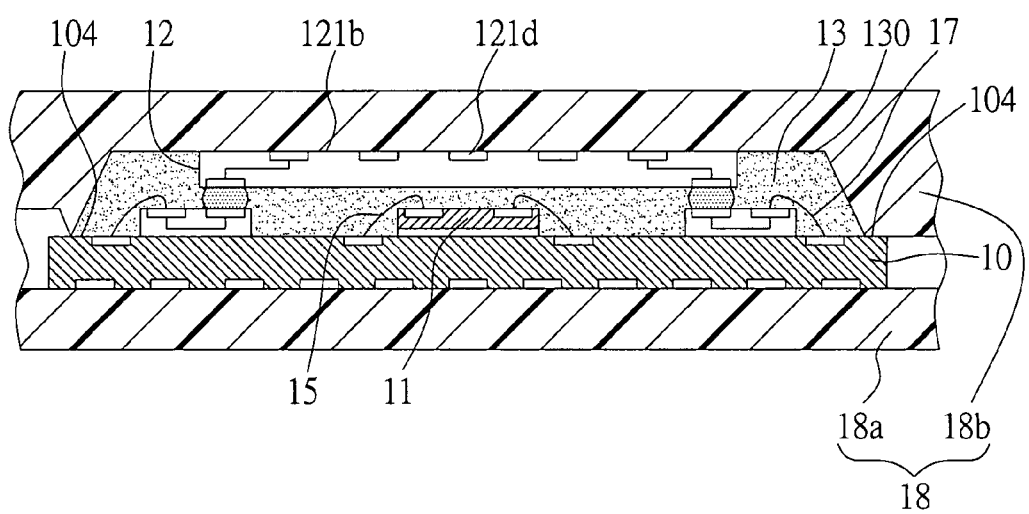

Referring to FIG. 2F, the structure of FIG. 2E is disposed in a lower mold 18a and an upper mold 18b of a mold 18 for performing a molding process so as to form an encapsulant 13 on the top surface 104 of the substrate 10 for encapsulating the electrical connecting structure 12, the semiconductor chip 11, the gold wires 15 and the bonding wires 17, wherein, the upper surface 121b of the upper layer circuit board 121 for mounting another semiconductor package (not shown) thereon is exposed from the encapsulant 13, and the upper surface 121b and the top surface 130 of the encapsulant 13 are in the same plane. As the upper surface 121b and the top surface 130 of the encapsulant 13 are in a same plane, insert design is not needed in mold cavity of the mold 18. Instead, a common mold can be used in the present molding process, which is helpful to save the fabrication cost.

Finally, the mold 18 is removed, and a plurality of solder balls 14 are mounted on the first solder pads 102a arranged in an array on the bottom surface 102 of the substrate 10. Thus, a semiconductor package 1 according to a first embodiment of the present invention is obtained, as shown in FIG. 1B.

Second Embodiment

Figure 3:
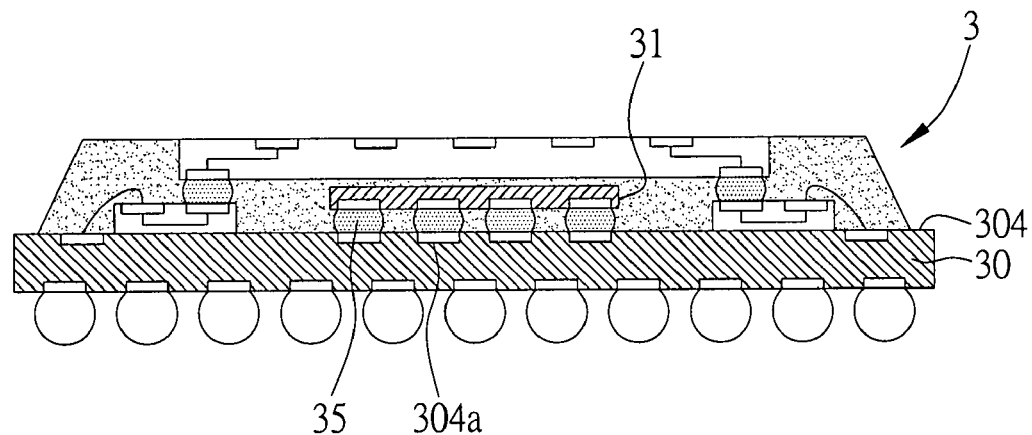
FIG. 3 is a schematic cross-sectional diagram of a semiconductor package according to a second embodiment of the present invention.

FIG. 3 is a schematic cross-sectional view of a semiconductor package 3 according to a second embodiment of the present invention. The semiconductor package 3 is similar to that of the first embodiment. The main difference of the semiconductor package 3 from the semiconductor package 1 of the first embodiment is that the semiconductor chip 31 is flip-chip electrically connected to the top surface 304 of the substrate 30. As shown in FIG. 3, the semiconductor chip 31 are connected to a plurality of first solder pads 304a on the top surface 304 of the substrate 30 by a plurality of corresponding solder bumps 35. Since the semiconductor chip 31 and the substrate 30 are electrically connected by soldering rather than gold wires, which extend outwards and occupy the available area of the substrate, the flip chip structure of the semiconductor chip 31 can further reduce size of whole semiconductor package or increase layout or available area of the substrate in view of the one connected by gold wires.

Third Embodiment

Figure 4:
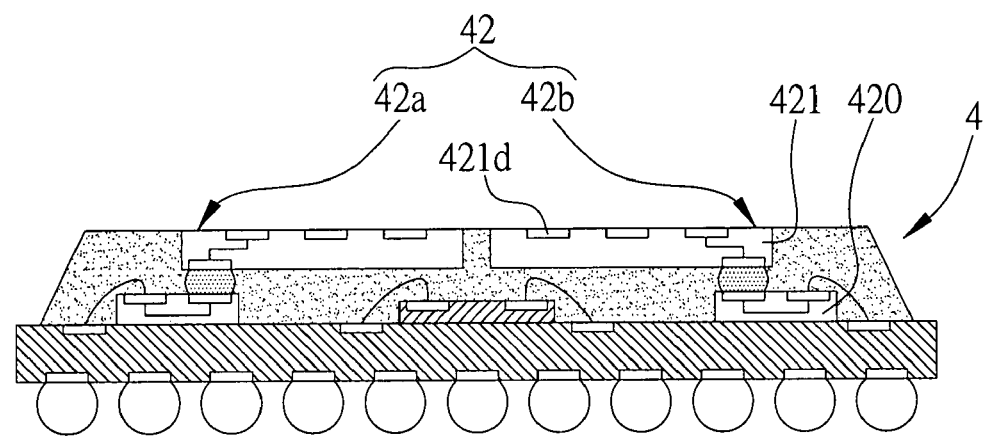
FIG. 4 is a schematic cross-sectional diagram of a semiconductor package according to a third embodiment of the present invention.

FIG. 4 is a schematic cross-sectional view of a semiconductor package 4 according to a third embodiment of the present invention. The semiconductor package 4 is similar to that of the first embodiment. The main difference of the semiconductor package 4 from the semiconductor package 1 of the first embodiment is that the electrical connecting structure 42 comprises two symmetrical portions 42a and 42b. Each of the portions has an upper layer circuit board 421 and a lower layer circuit board 420. And the semiconductor package 4 is further characterized in that as long as the number of the solder pads 421d of the upper layer circuit board 421 provided can meet the practical need, the material of the upper layer circuit board 421 required is much less in view of the first embodiment, thereby the packaging cost for the semiconductor package 4 is reduced.

Fourth Embodiment

Figure 5:
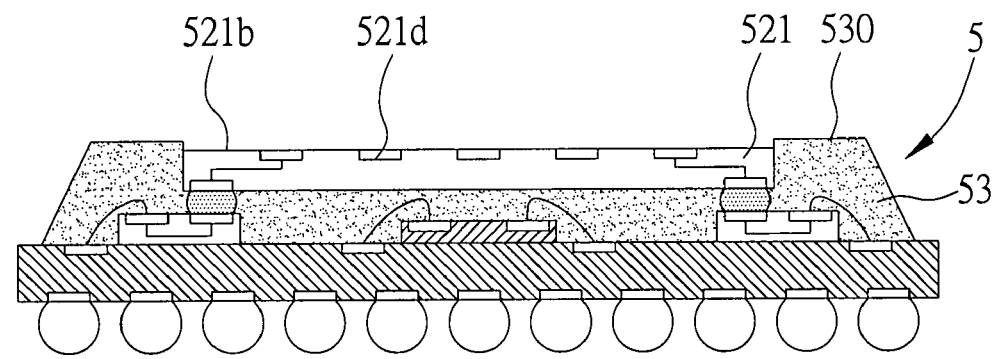
FIG. 5 is a schematic cross-sectional diagram of a semiconductor package according to a fourth embodiment of the present invention.

FIG. 5 is a schematic cross-sectional diagram of a semiconductor package according to a fourth embodiment of the present invention. The semiconductor package 5 is similar to that of the first embodiment. The main difference of the semiconductor package 5 from the semiconductor package 1 is that the upper surface 521b of the upper layer circuit board 521 is lower than the top surface 530 of the encapsulant 53. That is, the upper surface 521b and the top surface 530 are not in a same plane, which is caused by attaching a tape on the upper surface 521b for preventing the upper surface 521b from contaminations in the molding process and from an additional post cleaning process. Such a structure is formed through a fabrication method described as follows, wherein detailed descriptions of processes same as those in fabricating the semiconductor package 1 are omitted.

Figure 6A:
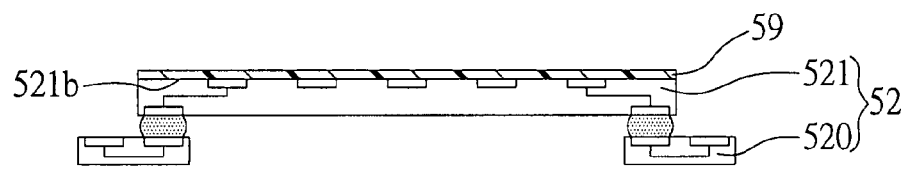
FIGS. 6A to 6D are schematic diagrams showing a fabrication method of a semiconductor package according to the fourth embodiment of the present invention.

As shown in FIG. 6A, an electrical connecting structure 52 consisting of a lower layer circuit board 520 and an upper layer circuit board 521 is prepared, and a tape 59 is attached to the upper surface 521b of the upper layer circuit board 521.

Figure 6B:
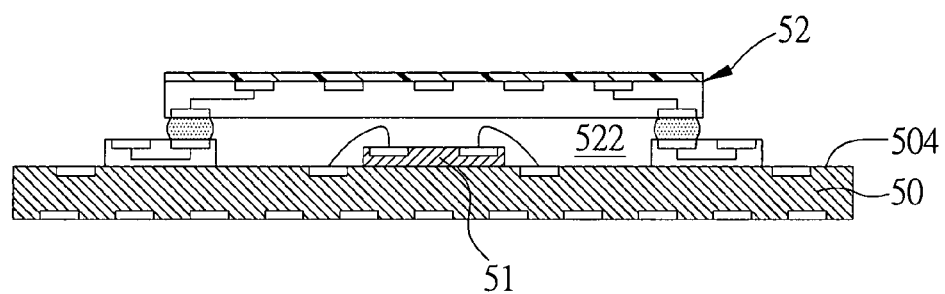

As shown in FIG. 6B, the electrical connecting structure 52 is adhered to the top surface 504 of the substrate 50 with the semiconductor chip 51 on the substrate 50 received in the receiving space 522 of the electrical connecting structure 52.

Figure 6C:
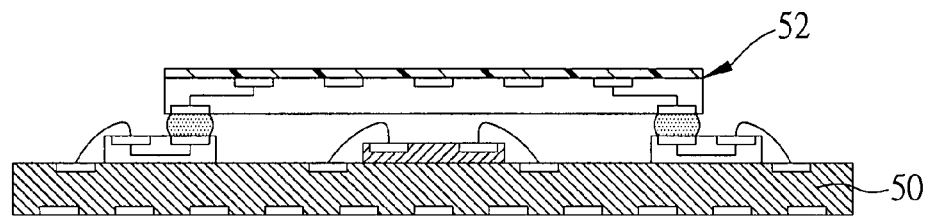
Figure 6D:
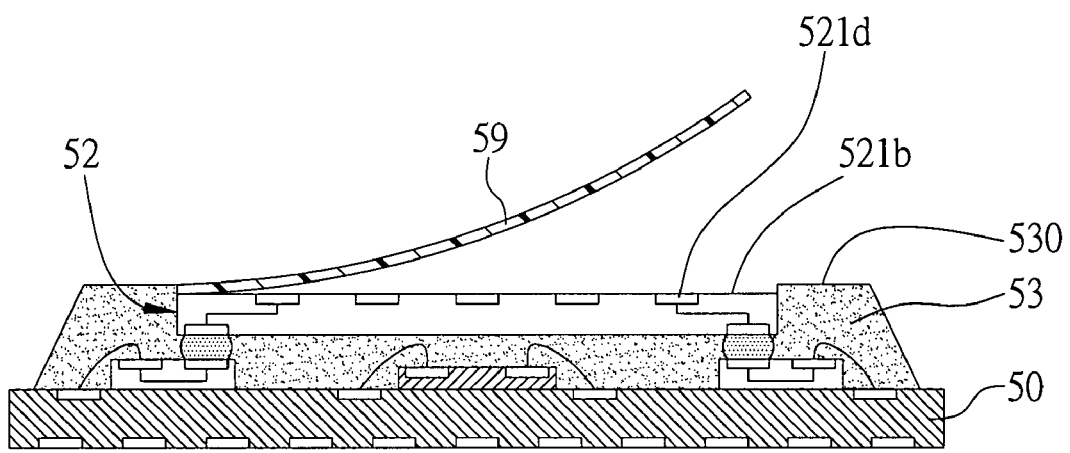
Figure 7:
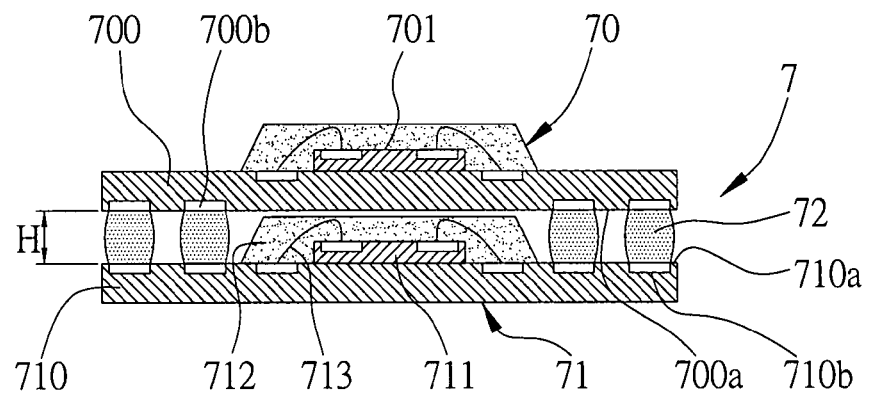
FIG. 7 (PRIOR ART) is a schematic cross-sectional view of a conventional stack-type multi-chip module.
Figure 8:
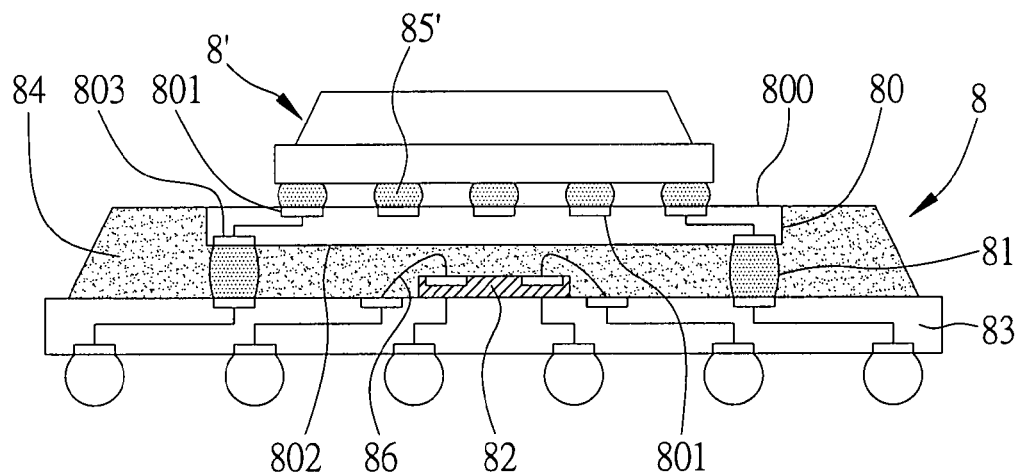
FIG. 8 (PRIOR ART) is a schematic cross-sectional diagram of a semiconductor package disclosed by U.S. Pat. No. 6,828,665.
Figure 9:
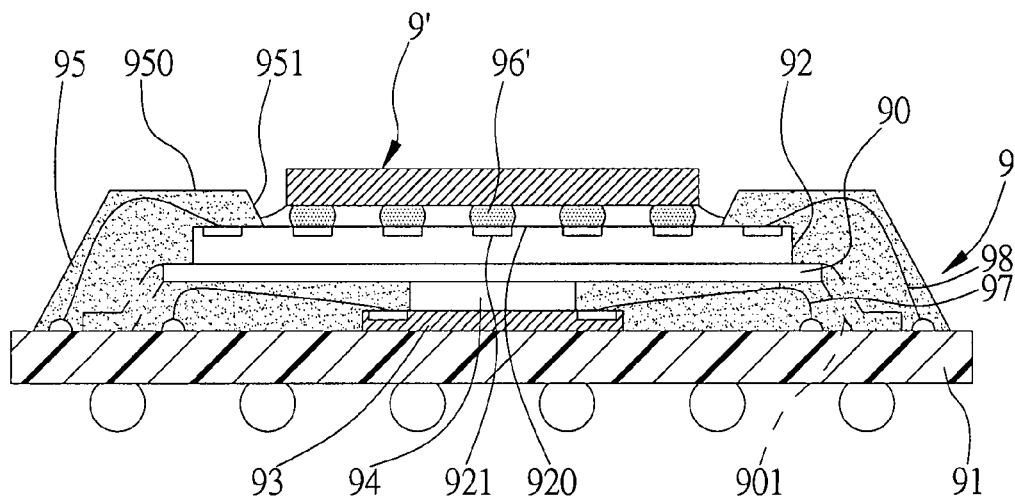
FIG. 9 (PRIOR ART) is a schematic cross-sectional view of a semiconductor package disclosed by U.S. Pat. No. 6,861,288.
Figure 10:
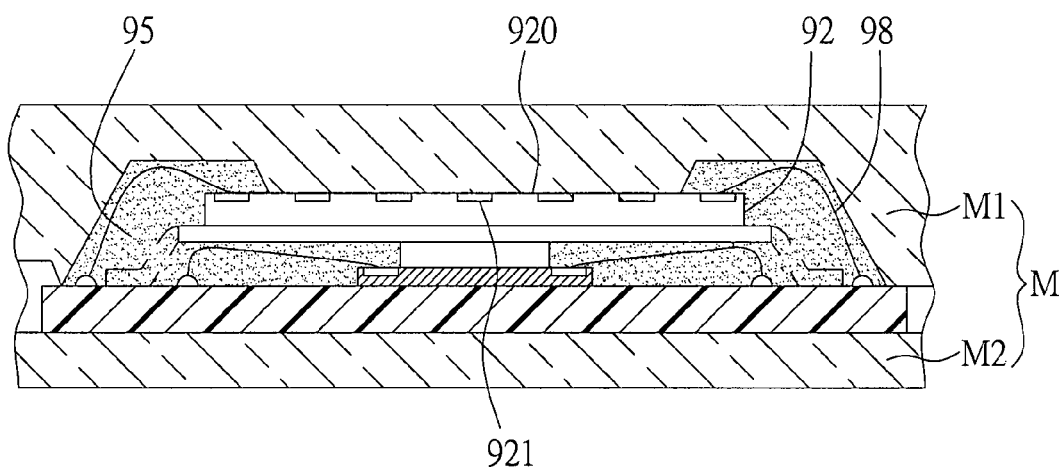
FIG. 10 (PRIOR ART) is a schematic cross-sectional diagram showing an encapsulant formed by a molding process according to U.S. Pat. No. 6,861,288.

Please refer to FIGS. 6C and 6D (the mold and the descriptions therefor are omitted for simplify the specification), a molding process is performed for forming an encapuslant 53 encapsulating the semiconductor chip 51 and the electrical connecting structure 52 with the tape 59 exposed from the top surface 530 of the encapsulant 53, wherein, the tape 59 can protect the upper surface 521b of the upper layer circuit board 521 from being contaminated. As shown in FIG. 6D, the tape 59 is removed from the upper surface 521b of the upper layer circuit board 521 so as to expose the plurality of solder pads 521d on the upper surface 521b and therethrough another semiconductor package stacked on the upper surface of the upper layer circuit board 521 can be electrically connected to the semiconductor package 5. As the tape 59 is removed after the encapsulant 53 is formed, the exposed upper surface 521b is lower than the top surface 530 of the encapsulant 53.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A semiconductor package on which a semiconductor device can be stacked, comprising:
    a substrate having a plurality of first bonding pads and second bonding pads;
    at least a semiconductor chip mounted on the substrate;
    a plurality of first electrical connecting elements electrically connecting the semiconductor chip and the first bonding pads of the substrate;
    an electrical connecting structure mounted on the substrate, wherein the electrical connecting structure consists of at least one upper layer circuit board and at least one lower layer circuit board electrically connected thereto, a receiving space is formed in the electrical connecting structure so as to receive the semiconductor chip and the plurality of first electrical connecting elements therein, the first bonding pads of the substrate are configured in the area covered by the electrical connecting structure, and the second bonding pads are configured outside the area covered by the electrical connecting structure;
    a plurality of second electrical connecting elements for electrically connecting the lower layer circuit board and the second bonding pads of the substrate so as to electrically connecting the electrical connecting structure to the substrate; and
    an encapsulant formed on the substrate for encapsulating the semiconductor chip, the plurality of first electrical connecting elements, the electrical connecting structure and the plurality of second electrical connecting elements, wherein an upper surface of the upper layer circuit board is exposed from the encapsulant.

2. The semiconductor package of claim 1, wherein the first and the second electrical connecting elements are bonding wires.

3. The semiconductor package of claim 1, wherein the first electrical connecting elements are solder bumps and the second electrical connecting elements are bonding wires.

4. The semiconductor package of claim 1, wherein the upper layer circuit board is supported by the lower layer circuit board and situated over the substrate for preventing the semiconductor chip and the first electrical connecting elements from contacting the electrical connecting structure.

5. The semiconductor package of claim 1, further comprising another electrical connecting structure, wherein the electrical connecting structures are symmetrically mounted on the substrate.

6. The semiconductor package of claim 1, wherein the electrical connecting structure consisting of one upper layer circuit board and two lower layer circuit boards.

7. The semiconductor package of claim 1, wherein the electrical connecting structure consisting of one upper layer circuit board and four lower layer circuit boards.

8. The semiconductor package of claim 1, further comprising an adhesive, wherein the electrical connecting structure is adhered by the adhesive to the substrate through a lower surface of the lower layer circuit board.

9. The semiconductor package of claim 1, wherein the upper and lower layer circuit boards of the electrical connecting structure are electrically connected by solder bumps or solder balls.

10. The semiconductor package of claim 1, wherein an upper surface of the lower layer circuit board is partially covered by the upper layer circuit board.

11. The semiconductor package of claim 10, wherein the upper surface of the lower layer circuit board has a first portion covered by the upper layer circuit board and a second portion exposed from the upper layer circuit board, and the lower layer circuit board comprises a plurality of solder pads on the first portion for connecting with the solder bumps or solder balls and a plurality of third bounding pads on the second portion for electrically connected with the second electrical connecting elements.

12. The semiconductor package of claim 1, wherein a plurality of solder pads arranged in an array are formed on upper surface of the upper layer circuit board for electrically connecting with another semiconductor device stacked on the upper surface of the upper layer circuit board.

13. The semiconductor package of claim 1, wherein the upper surface of the upper layer circuit board and the top surface of the encapsulant are in the same plane.

14. The semiconductor package of claim 1, wherein the upper surface of the upper layer circuit board is lower than the top surface of the encapsulant.

15. The semiconductor package of claim 1, further comprising a plurality of solder balls mounted on a bottom surface of the substrate for electrically connecting the semiconductor package to an external device.

16. A fabrication method of a semiconductor package on which a semiconductor device can be stacked, comprising the steps of:
    preparing an electrical connecting structure having an upper layer circuit board and a lower layer circuit board electrically connected thereto, and a receiving space formed under the upper layer circuit board;
    adhering the electrical connecting structure to a substrate having at least one semiconductor chip mounted thereon, a plurality of first bounding pads and a plurality of second bounding pads for configuring the first bounding pads located in an area covered by the electrical connecting structure and the second bounding pads being located outside the area covered by the electrical connecting structure, and electrically connecting the semiconductor chip to the first bounding pads by a plurality of first electrical connecting elements;
    electrically connecting the electrical connecting structure to the second bounding pads through a plurality of second electrical connecting elements; and
    forming an encapsulant encapsulating the semiconductor chip, the electrical connecting structure, and the first and second electrical connecting elements with an upper surface of the upper layer circuit board being exposed from the encapsulant.

17. The method of claim 16, wherein the step of adhering the electrical connecting structure to a substrate is performed by adhering a lower surface of the lower layer circuit board to the substrate.

18. The method of claim 16, further comprising electrically connecting the upper layer circuit board of the electrical connecting structure to the lower layer circuit board through a plurality of solder bumps or solder balls.

19. The method of claim 16, wherein the upper layer circuit board is supported by the lower layer circuit board and mounted over the semiconductor chip and the first electrical connecting elements so as to prevent the semiconductor chip and the first electrical connecting elements from contacting the electrical connecting structure.

20. The method of claim 16, further comprising a step of applying a tape to the upper surface of the upper layer circuit board.

21. The method of claim 20, further comprising a step of removing the tape from the upper surface of the upper layer circuit board after the step of forming an encapsulant so as to expose the upper surface of the upper layer circuit board from the encapsulant.

22. The method of claim 21, wherein the upper surface of the upper layer circuit board is lower than the top surface of the encapsulant.

23. The method of claim 16, wherein the upper surface of the upper layer circuit board and the top surface of the encapsulant are in the same plane.

24. The method of claim 16, wherein the first and second electrical connecting elements are bonding wires.

25. The method of claim 16, wherein the first electrical connecting elements are solder bumps and the second electrical connecting elements are bonding wires.

26. The method of claim 16, wherein the electrical connecting structure comprises two symmetrical portions, each of the portions having the upper layer circuit board and the lower layer circuit board electrically connected to the upper layer circuit board.

* * * * *